US011239016B2

(12) United States Patent
Zheng et al.

(10) Patent No.: US 11,239,016 B2
(45) Date of Patent: Feb. 1, 2022

(54) SPIN TORQUE OSCILLATOR WITH AN ANTIFERROMAGNETICALLY COUPLED ASSIST LAYER AND METHODS OF OPERATING THE SAME

(71) Applicant: WESTERN DIGITAL TECHNOLOGIES, INC., San Jose, CA (US)

(72) Inventors: Yuankai Zheng, Fremont, CA (US); Zheng Gao, Sunnyvale, CA (US); Susumu Okamura, San Jose, CA (US); James Freitag, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/887,715

(22) Filed: May 29, 2020

(65) Prior Publication Data
US 2021/0375518 A1  Dec. 2, 2021

(51) Int. Cl.
  *H01F 10/32*   (2006.01)
  *H03B 15/00*   (2006.01)
  *B82Y 25/00*   (2011.01)

(52) U.S. Cl.
  CPC ............ *H01F 10/329* (2013.01); *B82Y 25/00* (2013.01); *H01F 10/3254* (2013.01); *H03B 15/006* (2013.01)

(58) Field of Classification Search
  CPC .......... H03B 15/006; G11B 2005/3996; G11B 5/3909; H01F 10/3254; H01F 10/329; H01F 10/3268; B82Y 25/00; G11C 11/16; G11C 11/161; Y10T 428/1121
  See application file for complete search history.

(56) References Cited

U.S. PATENT DOCUMENTS 7,764,136 B2 * 7/2010 Suzuki ............... H01L 43/08
                                            331/107 SL
8,421,545 B2    4/2013 Kim et al.
(Continued)

FOREIGN PATENT DOCUMENTS

WO    WO 2017-023490 A1    2/2017

OTHER PUBLICATIONS

Notification of Transmittal of the International Search Report and the Written Opinion of the International Searching Authority for International Patent Application No. PCTUS2020/067638, dated Mar. 10, 2021, 9 pages.
(Continued)

*Primary Examiner* — Ryan Johnson
(74) *Attorney, Agent, or Firm* — The Marbury Law Group PLLC

(57) ABSTRACT

A spin torque oscillator includes a first electrode, a second electrode and a device layer stack located between the first electrode and the second electrode. The device layer stack includes a spin polarization layer including a first ferromagnetic material, an assist layer including a third ferromagnetic material, a ferromagnetic oscillation layer including a second ferromagnetic material located between the spin polarization layer and the assist layer, a nonmagnetic spacer layer located between the spin polarization layer and the ferromagnetic oscillation, and a nonmagnetic coupling layer located between the ferromagnetic oscillation layer and the assist layer. The assist layer is antiferromagnetically coupled to the ferromagnetic oscillation layer through the nonmagnetic coupling layer, and the assist layer has a magnetization that is coupled to a magnetization of the ferromagnetic oscillation layer.

16 Claims, 12 Drawing Sheets

(56) References Cited

U.S. PATENT DOCUMENTS

| | | |
|---|---|---|
| 9,083,279 B2 | 7/2015 | Park et al. |
| 9,966,901 B2 | 5/2018 | Apalkov et al. |
| 10,410,658 B1 | 9/2019 | Liu et al. |
| 2008/0031035 A1 | 2/2008 | Rodmacq et al. |
| 2014/0111283 A1 | 4/2014 | Nikonov et al. |
| 2017/0040945 A1 | 2/2017 | Kan et al. |
| 2017/0077394 A1 | 3/2017 | Saida |
| 2017/0178705 A1 | 6/2017 | Buhrman et al. |

OTHER PUBLICATIONS

USPTO Office Communication, Non-Final Office Action for U.S. Appl. No. 16/887,563, dated Mar. 29, 2021, 12 pages.

Zhu et al., "Microwave Assisted Magnetic Recording", Data Storage Systems Center, Dept. of Electrical & Computer Engineering, Carnegie Mellon University; IDEMA Dec. 6, 2007, 33 pages.

Feng et al., "Zero/field spin transfer oscillators based on magnetic tunnel junction having perpendicular polarizer and planar free layer", AIP Advances 6, 125305 (2016); https://doi.org/10.1063/1.4971229. 8 pages.

Kaka et al., "Mutual phase/locking of microwave spin torque nano/oscillators", NATURE, vol. 437|Sep. 15, 2005|doi:10.1038/nature04035, 4 pages.

Kiselev et al., "Microwave Oscillations of a nanomagnet driven by a spin/polarized current", NATURE, vol. 425, Sep. 25, 2003. 4 pages.

U.S. Appl. No. 16/887,563, filed May 29, 2020, Western Digital Technologies, Inc.

\* cited by examiner

SPIN TORQUE OSCILLATOR WITH AN ANTIFERROMAGNETICALLY COUPLED ASSIST LAYER AND METHODS OF OPERATING THE SAME

FIELD

The present disclosure relates generally to the field of microelectronic magnetic devices, and particularly a spin torque oscillator with an antiferromagnetically coupled assist layer and methods of operating the same.

BACKGROUND

Periodic pulse patterns having a frequency in the gigahertz range are employed in many electronic applications, such as wireless communication systems, radars, wireless network devices, automobile communication devices, and sound synthesizers. While many spin torque oscillator (STO) devices that generate periodic pulses with a frequency greater than 10 GHz are known in the art, many of such STO devices suffer a broad peak width and low Q factor at the oscillation frequency.

SUMMARY

According to embodiments of the present disclosure, a spin torque oscillator includes a first electrode, a second electrode and a device layer stack located between the first electrode and the second electrode. The device layer stack includes a spin polarization layer including a first ferromagnetic material, an assist layer including a third ferromagnetic material, a ferromagnetic oscillation layer including a second ferromagnetic material located between the spin polarization layer and the assist layer, a nonmagnetic spacer layer located between the spin polarization layer and the ferromagnetic oscillation, and a nonmagnetic coupling layer located between the ferromagnetic oscillation layer and the assist layer. The assist layer is antiferromagnetically coupled to the ferromagnetic oscillation layer through the nonmagnetic coupling layer, and the assist layer has a magnetization that is coupled to a magnetization of the ferromagnetic oscillation layer.

In the first embodiment, an electromagnet is located adjacent to the device layer stack and configured to direct a bias magnetic field through the device layer stack. In the second embodiment, at least one of the first or second electrode comprises a ferromagnetic material having a fixed magnetization and comprising a ferromagnetic electrode layer and a ferromagnetic pillar that protrudes from the ferromagnetic electrode layer toward the device layer stack the ferromagnetic pillar has substantially a same lateral width as a lateral width of the device layer stack, and a lateral width of the ferromagnetic electrode layer is larger than the lateral width of the ferromagnetic pillar, such that a ring shaped horizontal surface of the ferromagnetic electrode layer surrounds a base of the ferromagnetic pillar to provide a notch at a junction of the ferromagnetic electrode layer and the ferromagnetic pillar.

DETAILED DESCRIPTION

Figure 1A:
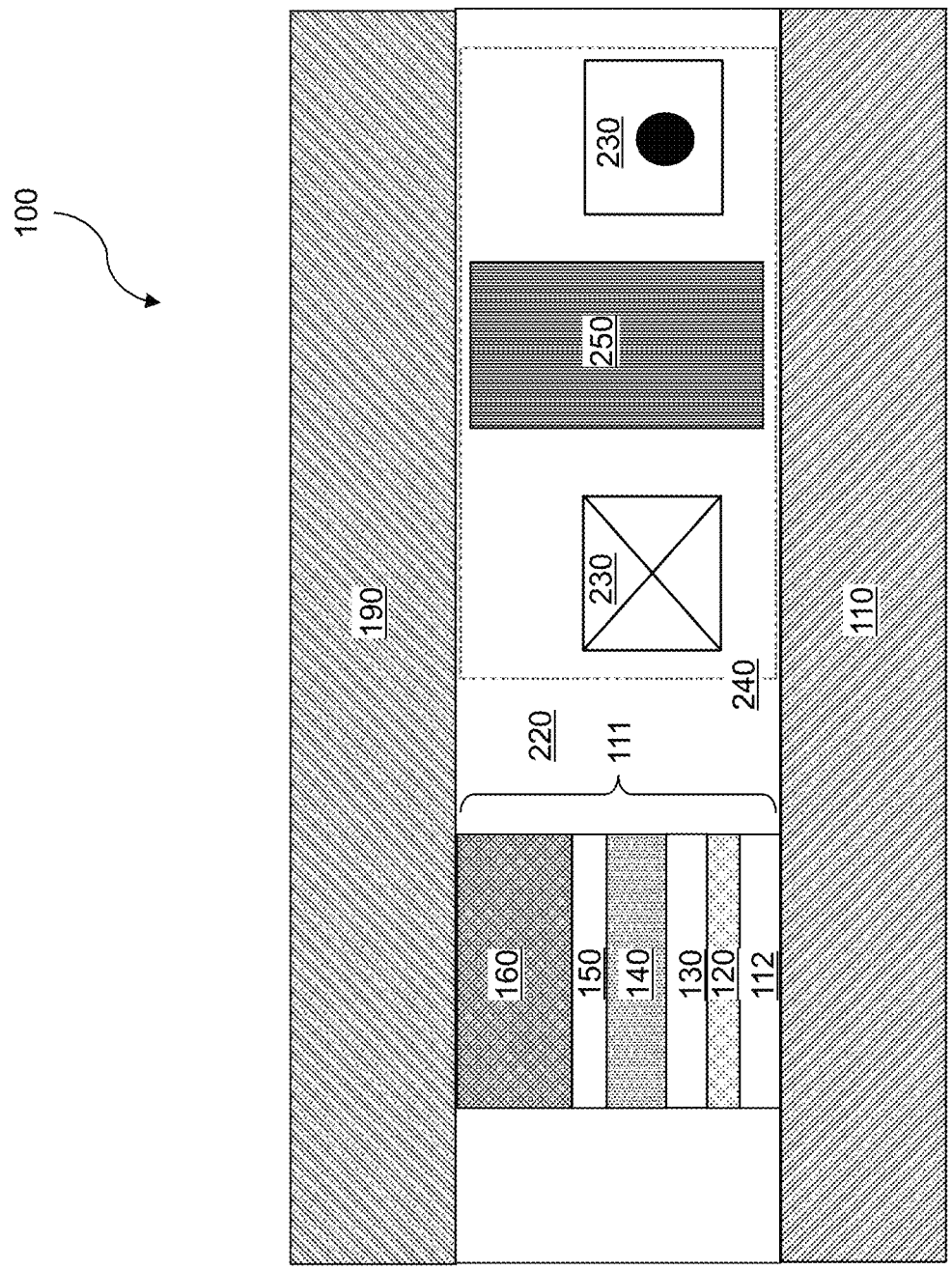
FIGS. 1A and 1B are vertical cross-sectional view of two alternative configurations of the first exemplary spin torque oscillator according to a first embodiment of the present disclosure.

As described above, the present disclosure is directed to STOs with an antiferromagnetically coupled assist layer and methods of operating the same, the various aspects of which are described below in detail. The STOs with the antiferromagnetically coupled assist layer have a narrower peak width at the oscillation frequency, which provide improved Q factor and performance in various communication devices or other devices which employ STOs.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, "magnetization" refers to a magnetization direction of a magnetic material.

As used herein, a "layer" refers to a material portion including a region having a thickness. A layer may extend over the entirety of an underlying or overlying structure, or may have an extent less than the extent of an underlying or overlying structure. Layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Figure 1B:
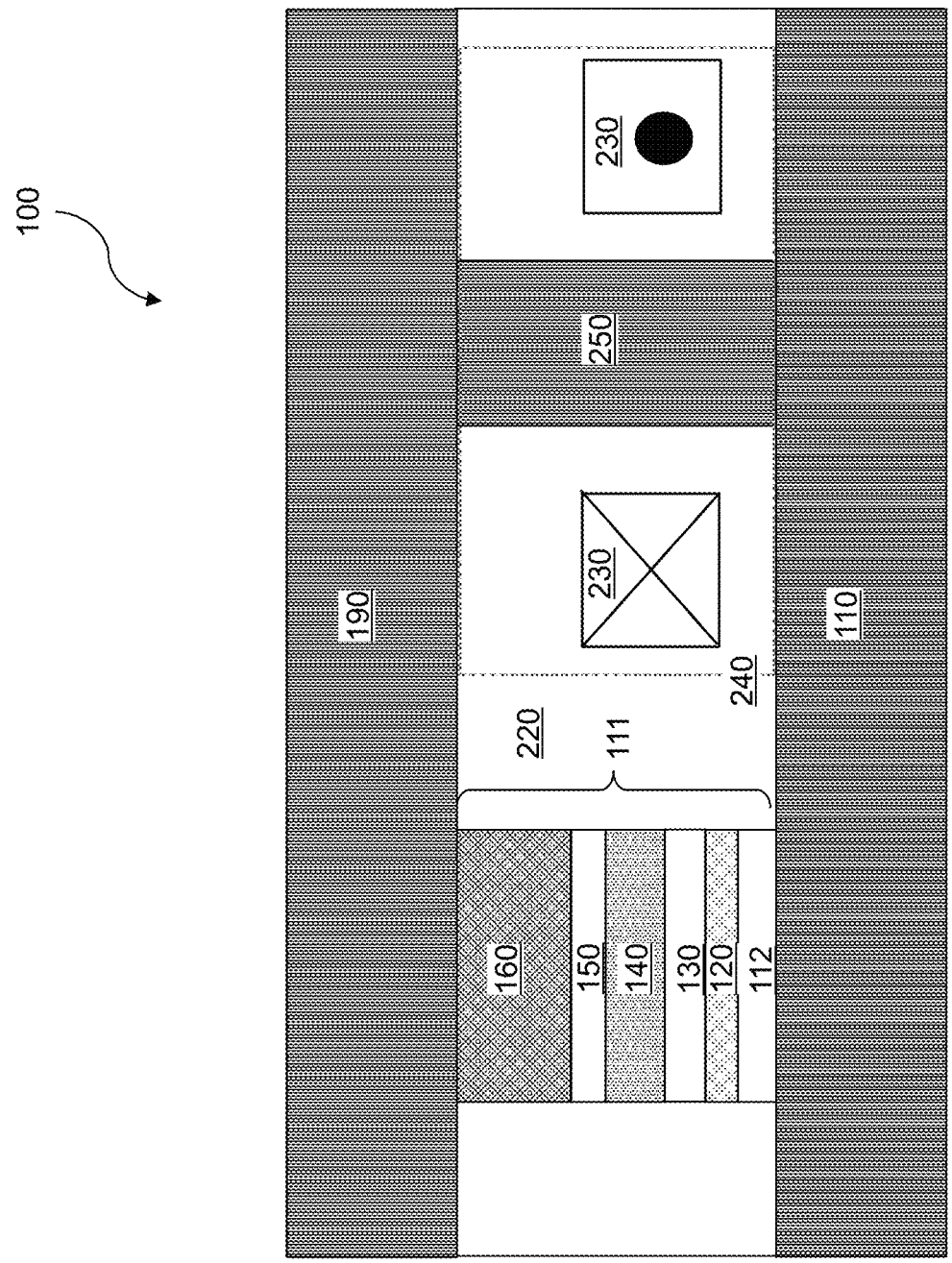

FIGS. 1A and 1B illustrate two different configurations of a first exemplary spin torque oscillator 100 according to a first embodiment of the present disclosure. The STO 100 contains a first electrode 110. In the configuration of FIG. 1A where the pole 250 of an electromagnet to be described below is not electrically connected to the first electrode 110, the first electrode 110 may comprise any suitable electrically conductive material. In one embodiment, the first electrode comprises a nonmagnetic electrically conductive material, such as a metal (e.g., Al, W, Ti, Cu, etc.), a metal alloy or a metallic nitride (e.g., TiN, WN, TaN, etc.).

In the configuration of FIG. 1B where the material of the pole 250 is also used to form the first electrode 110, and the pole 250 contacts the first electrode 110, the first electrode may comprise any suitable first soft magnetic material. As used herein, a soft magnetic material refers to a ferromagnetic material having intrinsic coercivity less than 1000 A/m. Soft magnetic materials are easily magnetized and easily demagnetized, and can be employed to enhance and/or channel the magnetic flux produced by an electric current. Exemplary soft magnetic materials that can be employed for the first electrode 110 include nickel-iron alloys, soft ferrites, and nickel-iron-chromium alloys. In one embodiment, the first soft magnetic material of the first electrode 110 can have intrinsic coercivity in a range from than 1 A/m to 100 A/m.

The first electrode 110 can be formed on a substrate (not shown), which is thick enough to provide mechanical support for the first electrode 110. For example, the substrate may be an insulating substrate (such as a quartz substrate or a ceramic substrate, such as a sapphire substrate), or a semiconductor substrate or a conductive substrate with an insulating layer (such as a silicon oxide or aluminum oxide layer) thereupon, on which the first electrode 110 can be formed.

An STO device layer stack 111 is located on the top surface of the first electrode 110. The STO device layer stack 111 includes, from bottom to top or from top to bottom, an optional nonmagnetic seed layer 112, a spin polarization layer 120 including a first ferromagnetic material, a nonmagnetic spacer layer 130, a ferromagnetic oscillation layer 140 including a second ferromagnetic material which may be the same or different from the first ferromagnetic material, a coupling layer 150, and an antiferromagnetically coupled assist layer 160 including a third ferromagnetic material, which may be the same as or different from the first and second ferromagnetic materials, and having a magnetization that is coupled to the magnetization of the ferromagnetic oscillation layer 140. While the present disclosure is described employing an embodiment in which the layers of the device layer stack are arranged from bottom to top, embodiments are expressly contemplated herein in which the device layer stack are arranged top to bottom.

The various layers of the device layer stack 111 may have vertically coincident sidewalls, i.e., sidewalls that are located within a same vertical plane. The horizontal cross-sectional shape of each layer within the device layer stack 111 may be the same, or may be substantially the same in case their sidewalls have a non-zero taper angle. The horizontal cross-sectional shape of the device layer stack 111 may be circular, elliptical, rectangular, of a shape of a rounded polygon (i.e., a polygon modified to provided rounded corners), or of any generally non-intersecting closed two-dimensional curvilinear shape. The lateral dimensions (such as a diameter or a side of a rectangle) of the device layer stack 111 can be in a range from 10 nm to 200 nm, such as from 20 nm to 100 nm, although lesser and greater lateral dimensional may also be employed.

The optional nonmagnetic seed layer 112 may be employed to enhance the crystalline properties of the material layers that are deposited thereupon. For example, the nonmagnetic seed layer 112 may include chromium, copper, tantalum, ruthenium, hafnium, niobium, tungsten, a nickel aluminum alloy, or combinations or alloys thereof. The thickness of the nonmagnetic seed layer 112 may be in a range from 1 nm to 2 nm, although lesser and greater thicknesses may also be employed.

The first ferromagnetic material of the spin polarization layer 120 can comprise, and/or can consist essentially of, Fe, Co, Ni, a ferromagnetic alloy including at least one of Fe, Co, and Ni, or a magnetic Heusler alloy. The thickness of the spin polarization layer 120 may be in a range from 1 nm to 3 nm, such as from 1.2 nm to 2 nm, although lesser and greater thicknesses can also be employed. As will be discussed below, the thickness of the spin polarization layer 120 may be determined based on the magnetic moment-thickness product of the spin polarization layer 120, i.e., based on the product of the magnetic moment (which is the magnitude of the magnetization) and the thickness of the spin polarization layer 120.

The nonmagnetic spacer layer 130 comprises, and/or consists essentially of, a nonmagnetic metal, a semiconductor material, or a dielectric metal oxide material having a thickness that allows charge tunneling. For example, the nonmagnetic spacer layer 130 may include any of chromium, copper, tantalum, ruthenium, hafnium, niobium, tungsten, a nickel aluminum alloy, zinc selenide, copper indium gallium selenide, magnesium oxide, or aluminum oxide. The thickness of the nonmagnetic spacer layer 130 may be in a range from 0.8 nm to 3 nm. In case a tunneling dielectric material is employed for the nonmagnetic spacer layer 130, the thickness of the nonmagnetic spacer layer 130 may be in a range from 0.8 nm to 1.2 nm. The thickness of the nonmagnetic spacer layer 130 can be selected such that the combination of the spin polarization layer 120, the nonmagnetic spacer layer 130, and the ferromagnetic oscillation layer 140 functions as a spin valve or a magnetic tunnel junction.

The second ferromagnetic material of the ferromagnetic oscillation layer 140 can comprise, and/or can consist essentially of, Fe, Co, Ni, a ferromagnetic alloy including at least one of Fe, Co, and Ni, or a magnetic Heusler alloy. The thickness of the ferromagnetic oscillation layer 140 may be in a range from 2 nm to 15 nm, such as from 4 nm to 10 nm, although lesser and greater thicknesses can also be employed. The thickness of the spin ferromagnetic oscillation layer 140 may be determined based on the magnetic moment-thickness product of the ferromagnetic oscillation layer 140. In one embodiment, the ferromagnetic oscillation layer 140 has a greater magnetic moment-thickness product than the spin polarization layer 120. In one embodiment, the ratio of the magnetic moment-thickness product of the ferromagnetic oscillation layer 140 to the magnetic moment-thickness product of the spin polarization layer 120 can be in a range from 1.2 to 5, such as from 2 to 4. Setting the ratio of the magnetic moment-thickness product of the ferromagnetic oscillation layer 140 to the magnetic moment-thickness product of the spin polarization layer 120 in a range from 1.2 to 5 causes antiferromagnetic alignment of a vertical component (i.e., the axial component) of the magnetization of the spin polarization layer 120 and a vertical component of the magnetization of the ferromagnetic oscillation layer 140 during operation as a spin valve or as a magnetic tunnel junction. If the material of the ferromagnetic oscillation layer 140 and the spin polarization layer 120 is the same, then the ferromagnetic oscillation layer 140 is 1.2 to 5 times thicker than the spin polarization layer 120. If the materials of the ferromagnetic oscillation layer 140 and the spin polarization layer 120 are different and have different magnetic moment, then the thickness of the layers may be adjusted to obtain the magnetic moment-thickness product ratio in the range from 1.2 to 5.

The nonmagnetic coupling layer 150 comprises, and/or consists essentially of, a metallic material that provides antiferromagnetic coupling between the ferromagnetic oscillation layer 140 and the antiferromagnetically coupled assist layer 160. For example, the antiferromagnetic coupling layer 150 can comprise, and/or can consist essentially of, ruthenium, rhodium, and/or iridium. The thickness of the nonmagnetic coupling layer 150 can be in a range from 0.4 nm to 2 nm, such as from 0.6 nm to 1.5 nm, although lesser and greater thicknesses may also be employed.

The third ferromagnetic material of the antiferromagnetically coupled assist layer 160 can comprise, and/or can consist essentially of, Fe, Co, Ni, a ferromagnetic alloy including at least one of Fe, Co, and Ni, or a magnetic Heusler alloy. The magnetization of the antiferromagnetically coupled assist layer 160 is fully antiparallel to the magnetization of the ferromagnetic oscillation layer 140 in absence of a current flowing through the stack 111. However, the magnetization of the antiferromagnetically coupled assist layer 160 may be fully or partly antiparallel to the magnetization of the ferromagnetic oscillation layer 140 under various operational conditions of the first exemplary spin torque oscillator 100 as will be described below. The thickness of the antiferromagnetically coupled assist layer 160 may be in a range from 2 nm to 100 nm, such as from 2 nm to 20 nm, although lesser and greater thicknesses can also be employed. As will be discussed below, the thickness of the antiferromagnetically coupled assist layer 160 may be determined based on the magnetic moment-thickness product of the ferromagnetic oscillation layer 140. In one embodiment, the antiferromagnetically coupled assist layer 160 has a greater magnetic moment-thickness product than the ferromagnetic oscillation layer 140. In one embodiment, the ratio of the magnetic moment-thickness product of the antiferromagnetically coupled assist layer 160 to the magnetic moment-thickness product of the ferromagnetic oscillation layer 140 can be in a range from 2 to 10. Setting the ratio of the magnetic moment-thickness product of the antiferromagnetically coupled assist layer 160 to the magnetic moment-thickness product of the ferromagnetic oscillation layer 140 in a range from 2 to 10 causes antiferromagnetic alignment of the in-plane component (i.e., the horizontal component) of the magnetization of the antiferromagnetically coupled assist layer 160 and the in-plane component of the magnetization of the ferromagnetic oscillation layer 140 during operation of a spin torque oscillator 100. If the material of the antiferromagnetically coupled assist layer 160 and the ferromagnetic oscillation layer 140 is the same, then the antiferromagnetically coupled assist layer 160 is 2 to 10 times ticker than the ferromagnetic oscillation layer 140. If the materials of the antiferromagnetically coupled assist layer 160 and the ferromagnetic oscillation layer 140 are different and have different magnetic moment, then the thickness of the layers may be adjusted to obtain the magnetic moment-thickness product ratio in the range from 2 to 10.

Generally, the device layer stack 111 can be formed on the first electrode 110. The layer stack includes, from bottom to top or from top to bottom, a spin polarization layer 120 including a first ferromagnetic material, a nonmagnetic spacer layer 130, a ferromagnetic oscillation layer 140 including a second ferromagnetic material, a coupling layer 150 contacting the ferromagnetic oscillation layer 140, and an antiferromagnetically coupled assist layer 160 including a third ferromagnetic material and having a magnetization that is coupled to a magnetization of the ferromagnetic oscillation layer 140. An optional nonmagnetic seed layer 112 may be formed directly on the top surface of the first electrode 110 below other layers of the device layer stack 111. The device layer stack 111 may be formed as a pillar structure having vertical sidewalls.

A second (upper) electrode 190 can be formed directly on a top surface of the device layer stack 111. In one embodiment, the second electrode 190 can be formed directly on the top surface of the antiferromagnetically coupled assist layer 160. The second electrode 190 may be formed of the same material as the first electrode 110.

A dielectric layer 220 surrounds the device layer stack 111. The dielectric layer 220 includes a dielectric material, such as silicon oxide, silicon nitride, a dielectric metal oxide (e.g., aluminum oxide), or silicon carbide nitride.

An electromagnet 240 containing a conductive coil 230 surrounding a soft magnetic pole 250 is located adjacent to at least one side of the device layer stack 111. The conductive coil 230 includes an electrically conductive material, such as copper, silver, gold, aluminum, tungsten, or ruthenium. While a conductive coil 230 with a single loop is schematically illustrated in FIGS. 1A and 1B, embodiments include a coil 230 with multiple loops (such as a spiral that surrounds the pole) are expressly include herein.

The soft magnetic pole 250 includes any soft magnetic material, such as a nickel-iron alloy, soft ferrite, or nickel-iron-chromium alloy. In one embodiment, the soft magnetic material can have intrinsic coercivity in a range from than 1 A/m to 100 A/m. In the first configuration of the STO 100 shown in FIG. 1A, the dielectric layer 220 separates the soft magnetic pole 250 from the first and second electrodes (110, 190). In the second configuration of the STO 100 shown in FIG. 1B, the soft magnetic pole 250 contacts and is made from the same soft magnetic material as the first and second electrodes (110, 190). In one embodiment, the electromagnet 240 and the device layer stack 111 can be embedded in the dielectric material layer 220.

The structure illustrated in FIGS. 1A and 1B is a first exemplary spin torque oscillator 100. The electromagnet 240 is configured to direct a bias magnetic field through the device layer stack 111 when the electromagnet is turned on by applying a current to the coil 230. A control circuit (not shown) is configured to apply a bias voltage or current between the first electrode 110 and the second electrode 190 to cause a spin current to flow through the device layer stack 111 between the electrodes (110, 190), as will be described in more detail below. The first exemplary spin torque oscillator 100 can be employed to provide a periodic signal generator, which may generate a periodic sinusoidal output or a periodic pulse pattern.

Figure 2:
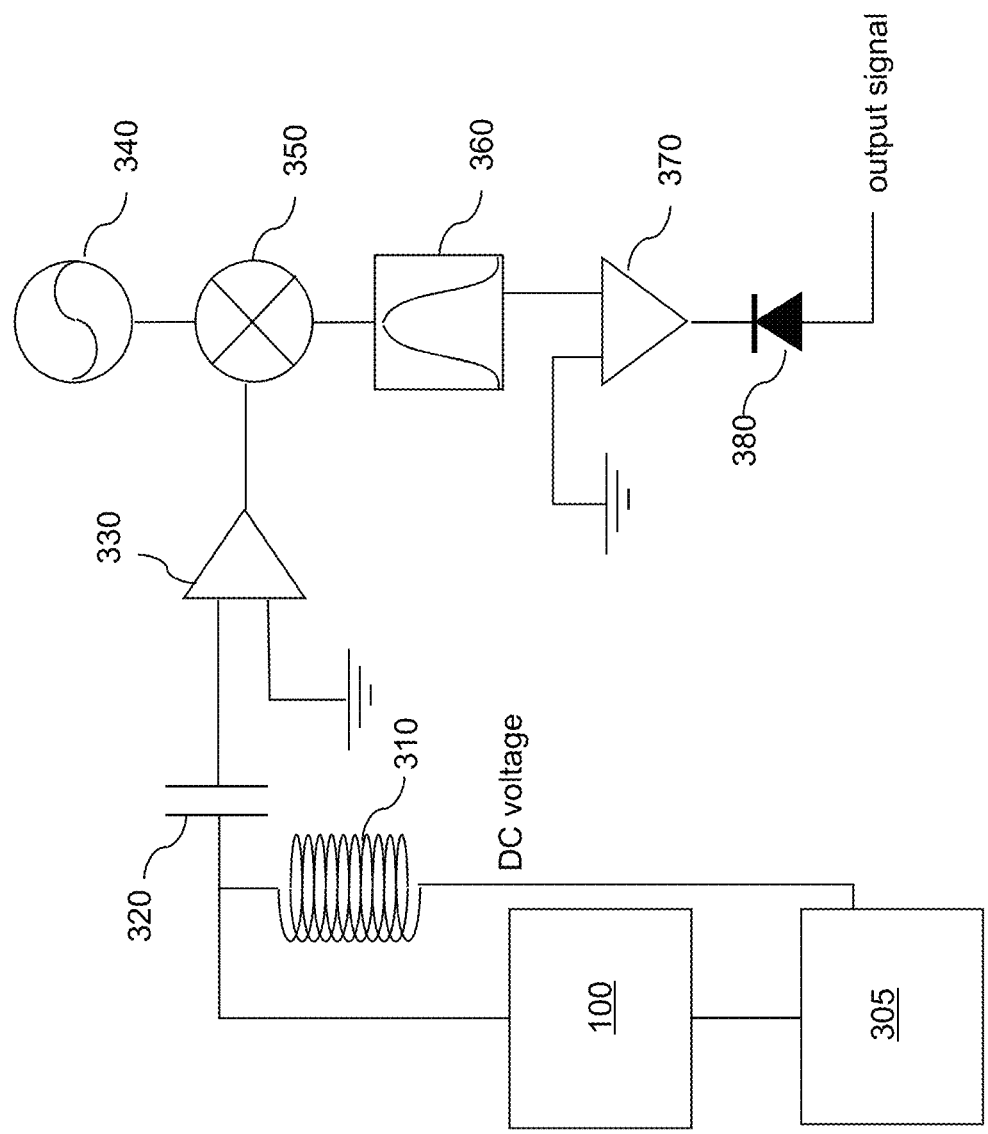
FIG. 2 is a schematic view of a first exemplary periodic signal generator according to the first embodiment of the present disclosure.

Referring to FIG. 2, a first exemplary periodic signal generator according to the first embodiment of the present disclosure is illustrated. The first periodic signal generator includes the first exemplary spin torque oscillator 100 illustrated in FIGS. 1A and 1B, a control circuit 305 and a heterodyne mixer circuit configured to output a periodic signal having a frequency in a range from 2 GHz to 100 GHz and described in S. Kisilev, et al., Nature, Vol. 425, page 380, 25 Sep. 2003, incorporated herein by reference in its entirety. The first exemplary periodic signal generator can include a control circuit 305 configured to induce flow of a direct current through the device layer stack 111 by application of a direct current bias voltage between the first electrode 110 and the second electrode 190 to induce the spin current through the device layer stack 111, and/or configured to provide a current through the coil 230 of the electromagnet 240 to generate a magnetic field in the electromagnetic 240.

The heterodyne mixer circuit includes an inductor 310 connected between the D.C. voltage source and the electrical output of the STO 100. The output signal from the device layer stack 111 can be transmitted to an operational amplifier 330 through a capacitor 320. The output signal from the operational amplifier 330 can be mixed with an output signal from a swept signal generator 340 in a mixer 350. The output signal from the mixer 350 is fed into a band pass filter 360. The filter 360 passes a signal in a range of 25-100 MHz. The output signal from the band pass filer 360 can be subsequently amplified by another operational amplifier 370, and can be passed through a diode detector 380 to generate a microwave frequency output signal. The first periodic signal generator can generate a periodic pulse signal having a frequency in a range from 2 GHz to 100 GHz, such as from 5 GHz to 30 GHz, with narrow pulse width although lower and higher frequencies may also be employed. Other output/ mixer circuits may also be used.

Figure 3:
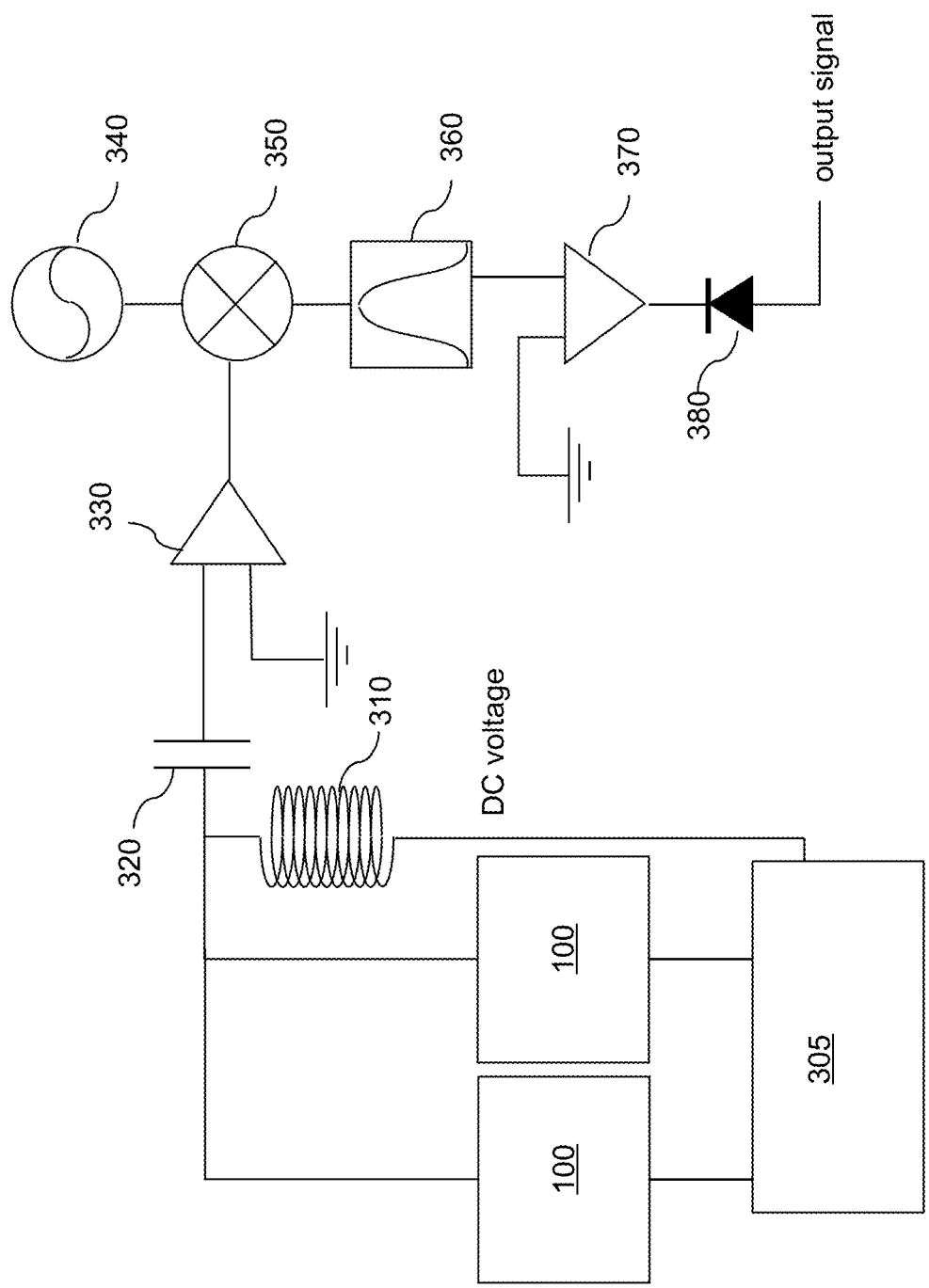
FIG. 3 is a schematic view of a second exemplary periodic signal generator according to the first embodiment of the present disclosure.

Referring to FIG. 3, a second exemplary periodic signal generator according to the first embodiment of the present disclosure is illustrated, which can be derived from the first exemplary periodic signal generator of FIG. 2 by connecting multiple instances (such as two or more instances) of the first exemplary spin torque oscillator 100 of FIGS. 1A and 1B in a parallel connection configuration. In this case, the first exemplary structure of FIGS. 1A and 1B may be modified to form a plurality of device layer stacks 111. The multiple instances of the spin torque oscillator 100 in the second exemplary periodic signal generator can generate a stabilized high frequency output signal.

Figure 4A:
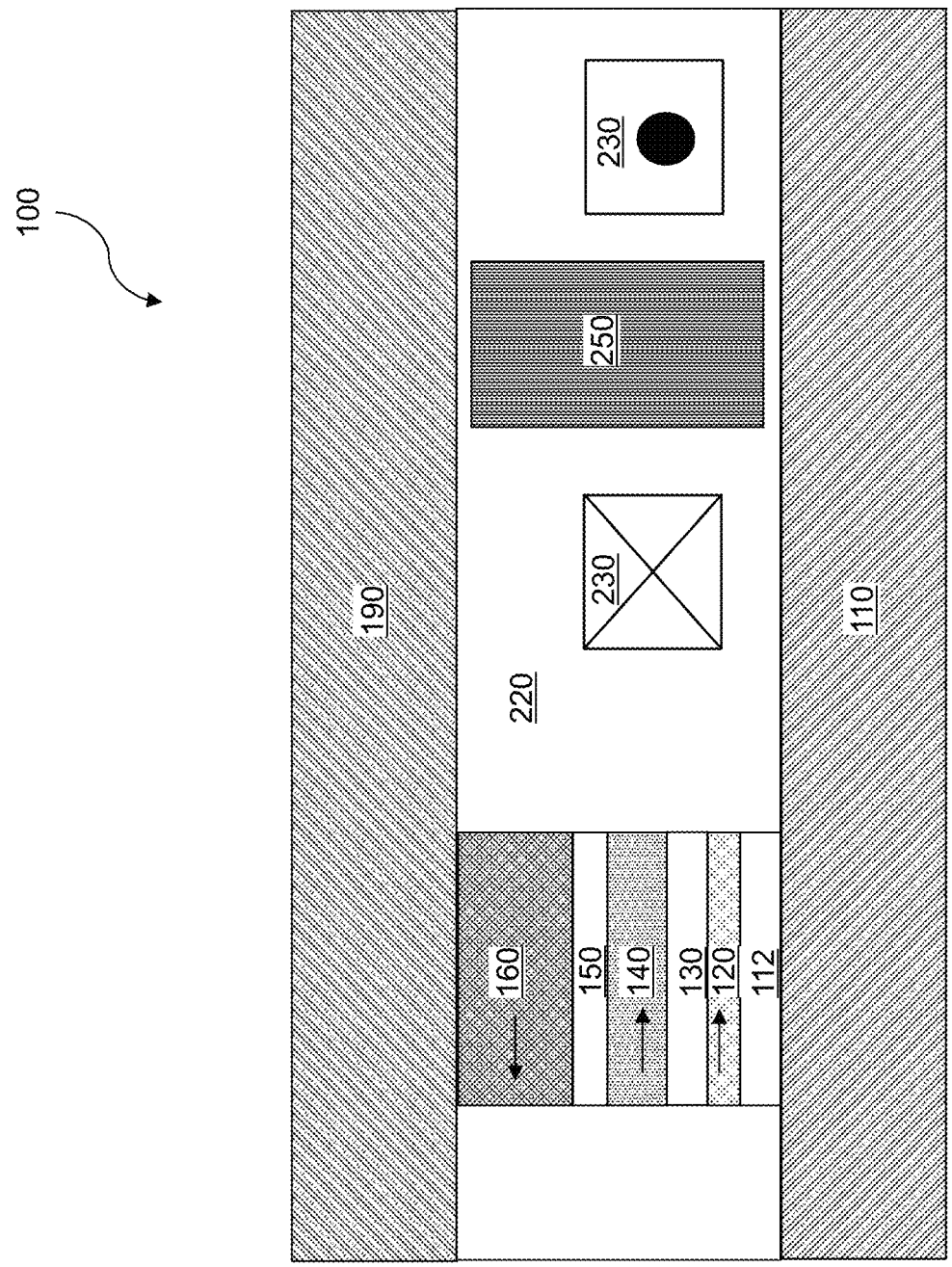
FIG. 4A is a vertical cross-sectional view of the first exemplary spin torque oscillator in the absence of an external magnetic field and in the absence of a spin current according to the first embodiment of the present disclosure.

The device layer stack 111 may be tuned by either the magnetic field from the electromagnet 240 or the spin current generated by applying a bias voltage between the first and second electrodes (110, 190). Referring to FIG. 4A, alignment of magnetizations of component layers within the device layer stack 111 in the first exemplary spin torque oscillator 100 is illustrated in the absence of external magnetic field (i.e., when no current flows through the coil 230 of the electromagnet) and in the absence of a bias spin current flowing through the device layer stack 111 according to the first embodiment of the present disclosure. While the structure of FIG. 1A is shown in FIGS. 4A-4C, it should be understood that the structure of FIG. 1B may be used instead.

Under such conditions, the magnetization of the spin polarization layer 120 and the ferromagnetic oscillation layer 140 can be ferromagnetically coupled, and the magnetization of the ferromagnetic oscillation layer 140 and the magnetization of the antiferromagnetically coupled assist layer 160 can be antiferromagnetically coupled. For example, the magnetization of the ferromagnetic oscillation layer 140 and the magnetization of the spin polarization layer 120 can be in-plane magnetizations that are parallel to an interface between the spin polarization layer 120 and the nonmagnetic spacer layer 130 while the electromagnet 140 is turned off and the spin current does not flow through the device layer stack 111. For example, the magnetization of the ferromagnetic oscillation layer 140 and the magnetization of the antiferromagnetically coupled assist layer 160 can be in-plane magnetizations that are antiparallel to each other and are parallel to an interface between the ferromagnetic oscillation layer 140 and the coupling layer 150 while the electromagnet 140 is turned off and the spin current does not flow through the device layer stack 111.

Figure 4B:
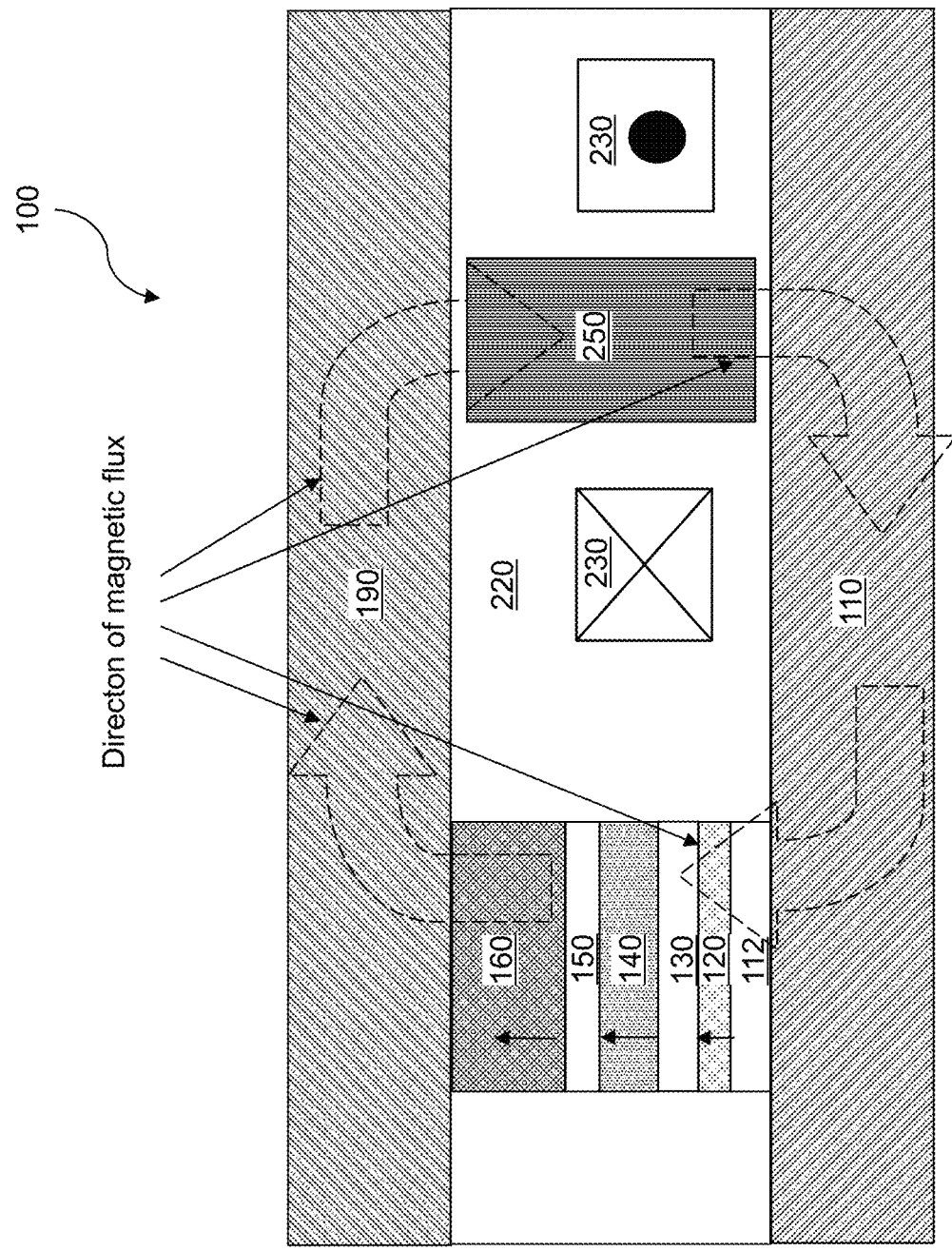
FIG. 4B is a vertical cross-sectional view of the first exemplary spin torque oscillator in the presence of the external magnetic field and in the absence of a spin current according to the first embodiment of the present disclosure.
Figure 4C:
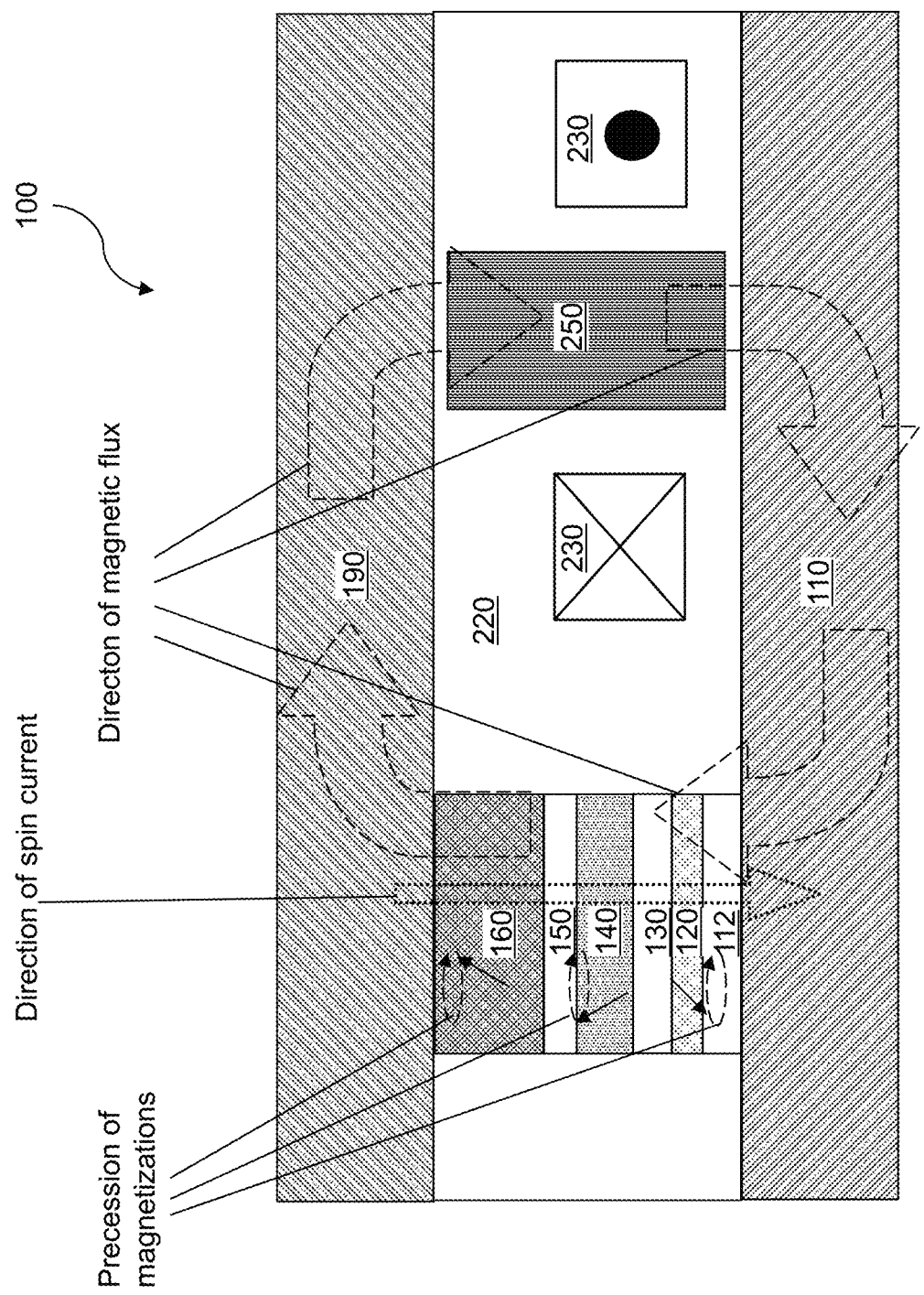
FIG. 4C is a vertical cross-sectional view of the first exemplary spin torque oscillator in the presence of the external magnetic field and in the presence of a spin current according to the first embodiment of the present disclosure.

Referring to FIG. 4B, alignment of magnetizations of component layers within the device layer stack 111 in the first exemplary spin torque oscillator 100 is illustrated in the presence of external magnetic field and in the absence of the bias spin current according to the first embodiment of the present disclosure. In this case, the electromagnet 240 can be turned on without applying the bias voltage between the first and second electrodes (110, 190). In other words, no spin current flows between the first electrode 110 and the second electrode 190. The electromagnet 240 can be turned on by flowing a direct current through the conductive coil 230, which generates a magnetic field in the soft magnetic material pole 250. The magnetic field generated by the electromagnet 240 is guided through the soft magnetic material pole 250, and generates a bias magnetic field within the adjacent device layer stack 111 to tune the STO 100 frequency. The bias magnetic field causes the various magnetizations of magnetic layers (120, 140, 160) to align along the direction of the bias magnetic field, which may be upward or downward. In the illustrated example, the magnetization of the spin polarization layer 120, the magnetization of the ferromagnetic oscillation layer 140, and the magnetization of the antiferromagnetically coupled assist layer 160 can be aligned upward along the vertical direction.

The bias magnetic field is vertical within the device layer stack 111, and the magnitude of the bias magnetic field can be selected to overcome the antiferromagnetic alignment of the axial component (i.e., the vertical component) of the magnetization of the ferromagnetic oscillation layer 140 and the axial component of the magnetization of the antiferromagnetically coupled assist layer 160. In other words, the bias magnetic field overcomes the tendency for the magnetization of the ferromagnetic oscillation layer 140 and the magnetization of the antiferromagnetically coupled assist layer 160 to couple to each other antiferromagnetically. As a consequence, the axial component of the magnetization of the ferromagnetic oscillation layer 140 and the axial component of the magnetization of the antiferromagnetically coupled assist layer 160 can be parallel to the bias magnetic field while the electromagnet 240 is turned on. In one embodiment, the magnetization of the ferromagnetic oscillation layer 140 and the magnetization of the spin polarization layer 120 can be axial magnetizations that are parallel to the bias magnetic field while the electromagnet 240 is turned on and the spin current does not flow through the device layer stack 111.

Referring to FIG. 4C, alignment of magnetizations of component layers within the device layer stack 111 in the first exemplary spin torque oscillator 100 is illustrated in the presence of external magnetic field generated by the electromagnet 140 when current flows through the coil 230, and in the presence of a direct current bias spin current according to the first embodiment of the present disclosure. A direct current bias voltage may be applied between the first electrode 110 and the second electrode 190 to generate the spin current in the device layer stack 111. The direction of the bias magnetic field and the spin current in the device layer stack 111 may be antiparallel.

The magnetization of the spin polarization layer 120 oscillates (e.g., precesses) at a lower spin current than the magnetization of the ferromagnetic oscillation layer 140. The magnetization of the ferromagnetic oscillation layer 140 oscillates (e.g., precesses) at a higher spin current, which causes tilting and precession of the magnetization. The magnetization of the spin polarization layer 120 (which has a lower magnetic moment-thickness product) follows the magnetization of the ferromagnetic oscillation layer 140 in an antiparallel direction, while the azimuthal angle of the in-plane component of the magnetization of the ferromagnetic oscillation layer 140 can be the same as the azimuthal angle of the in-plane component of the magnetization of the spin polarization layer 120.

The layer stack of the spin polarization layer 120, the nonmagnetic spacer layer 130, and the ferromagnetic oscillation layer 140 functions as a spin valve or as a magnetic tunnel junction depending on whether the nonmagnetic spacer layer is conductive or insulating. Spin polarization of the electrical current occurs through the spin valve or through the magnetic tunnel junction. The preferential passing of spin-polarized electrons through the nonmagnetic spacer layer 130 causes the axial component of the magnetization of the spin polarization layer 120 to be antiferromagnetically aligned to the axial component of the magnetization of the ferromagnetic oscillation layer 140.

When the ratio of the magnetic moment-thickness product of the ferromagnetic oscillation layer 140 to the magnetic moment-thickness product of the spin polarization layer 120 is in a range from 1.2 to 5, such as from 1.4 to 3, the axial component of the magnetization of the ferromagnetic oscillation layer 140 can be aligned parallel to the bias magnetic field, and the axial component of the magnetization of the spin polarization layer 120 can be aligned antiparallel to the bias magnetic field in order to minimize the total energy of the magnetic configuration of the spin valve or the magnetic tunnel junction. However, this configuration is energetically unfavorable for the magnetization of the spin polarization layer 120, and causes the magnetization of the spin polarization layer 120 to tilt away from the vertical direction, thereby producing an in-plane component of the magnetization of the spin polarization layer 120. The in-plane component of the magnetization of the spin polarization layer 120 precesses around the vertical direction in the presence of the bias magnetic field.

The in-plane component of the magnetization of the spin polarization layer 120 causes the magnetization of the ferromagnetic oscillation layer 140 to tilt away from the vertical direction. The generally ferromagnetic coupling between the magnetization of the spin polarization layer 120 and the magnetization of the ferromagnetic oscillation layer 140 causes the tilt of the magnetization of the ferromagnetic oscillation layer 140 to be locked along the direction of the in-plane component of the magnetization of the spin polarization layer 120. In other words, the in-plane component of the magnetization of the ferromagnetic oscillation layer 140 can have the same azimuthal angle around the vertical axis as the in-plane component of the magnetization of the spin polarization layer 120. Thus, the magnetization of the spin polarization layer 120 and the magnetization of the ferromagnetic oscillation layer 140 precesses around the vertical direction in synchronization with a same precession frequency.

The axial component of the magnetization of the antiferromagnetically coupled assist layer 160 remains parallel to the direction of the bias magnetic field within the device layer stack 111 while the electromagnet 240 is turned on and the spin current flows through the device layer stack 111. Due to the antiferromagnetic nature of coupling between the antiferromagnetically coupled assist layer 160 and the ferromagnetic oscillation layer 140, the in-plane component of the magnetization of the ferromagnetic oscillation layer 140 and the in-plane component of the magnetization of the antiferromagnetically coupled assist layer 160 are antiferromagnetically coupled with each other while the electromagnet 240 is turned on and the spin current flows through the device layer stack 111. Thus, the assist layer 160 causes the tilt angle of the magnetization of the ferromagnetic oscillation layer 140 to increase, which decreases the peak width of the signal output by the STO 100.

The magnetization of the antiferromagnetically coupled assist layer 160 is coupled to the magnetization of the ferromagnetic oscillation layer 140, and precesses around the vertical axis with the same precession frequency as the magnetization of the spin polarization layer 120. The azimuthal angle of the in-plane component of the magnetization of the ferromagnetic oscillation layer 140 can be the same as the azimuthal angle of the in-plane component of the magnetization of the spin polarization layer 120, and can be offset by 180 degrees from the azimuthal angle of the in-plane component of the magnetization of the antiferromagnetically coupled assist layer 160.

According to an aspect of the present disclosure, a ratio in a range from 2 to 10, of the magnetic moment-product thickness of the antiferromagnetically coupled assist layer 160 to the magnetic moment-produce thickness of the ferromagnetic oscillation layer 140 provides stability to the vertical component of the antiferromagnetically coupled assist layer 160 to ensure that the vertical component of the antiferromagnetically coupled assist layer 160 remains parallel to the bias magnetic field, while providing sufficient antiferromagnetic coupling between the in-plane component of the magnetization of the antiferromagnetically coupled assist layer 160 and the in-plane component of the ferromagnetic oscillation layer 140 to increase the tilt angle of the magnetization of the ferromagnetic oscillation layer 140. The in-plane component of the magnetization of the antiferromagnetically coupled assist layer 160 and the in-plane component of the ferromagnetic oscillation layer 140 remain locked in an antiferromagnetic alignment (i.e., a 180 degree difference in azimuthal angles) during precession of the magnetizations of the spin polarization layer 120, the ferromagnetic oscillation layer 140, and the antiferromagnetically coupled assist layer 160 during synchronized precession.

Figure 5:
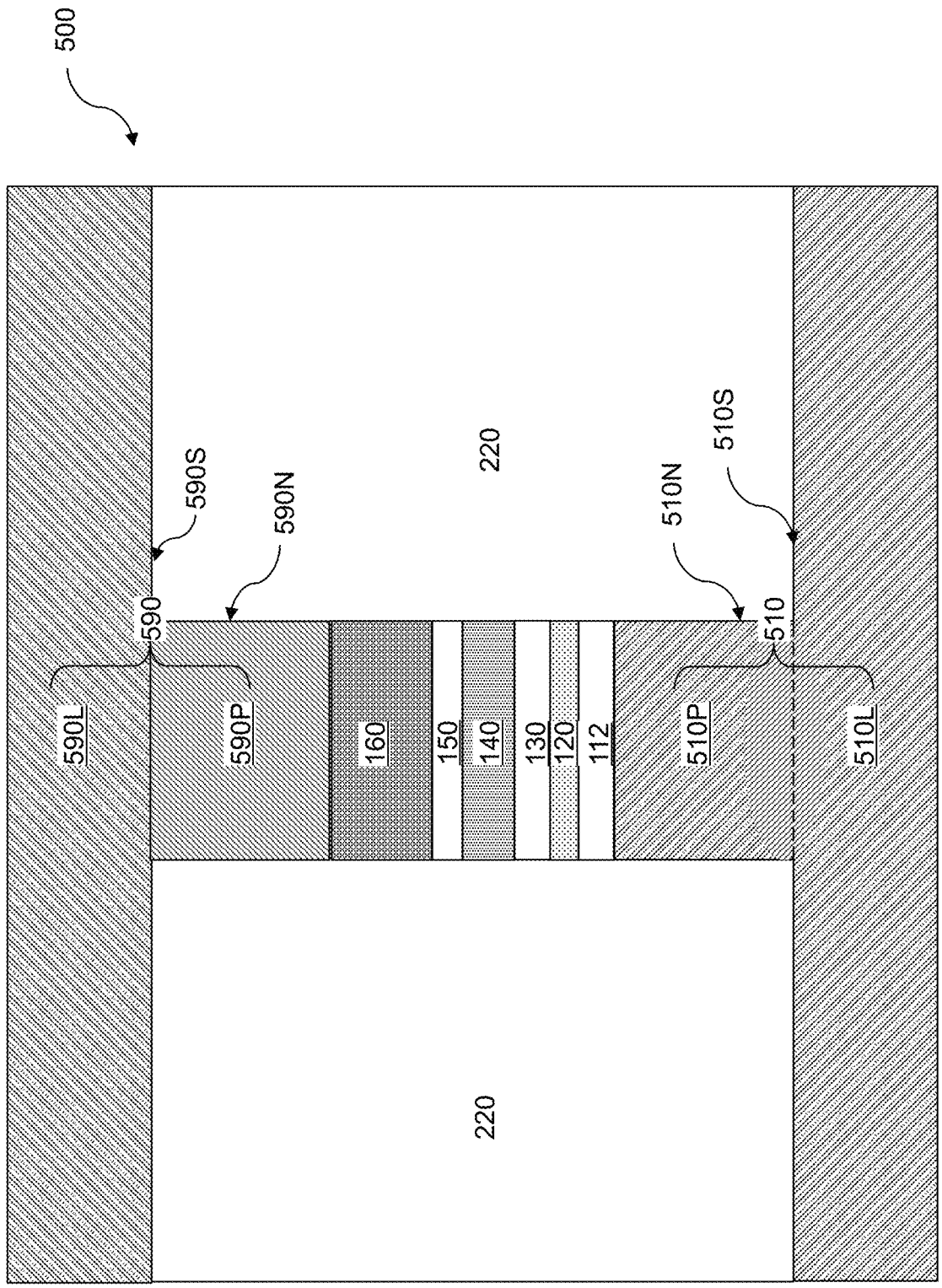
FIG. 5 is a vertical cross-sectional view of a second exemplary spin torque oscillator according to a second embodiment of the present disclosure.

FIG. 5 illustrates a second exemplary spin torque oscillator 500 according to a second embodiment of the present disclosure. The second exemplary STO 500 includes the same device layer stack 111 as described above with respect to the first exemplary STO 100. Therefore, the device layer stack 111 layers will not be described again for brevity. The second exemplary STO 500 excludes the electromagnet 240 of the first embodiment. Instead, the second exemplary STO 500 includes at least one notch which generates a magnetic field as will be described below.

The second exemplary STO 500 contains a first electrode 510 and a second electrode 590. The first electrode 510 includes a first ferromagnetic electrode layer 510L and a first ferromagnetic pillar 510P that protrudes from the first ferromagnetic electrode layer 510L toward the device layer stack 111. The second electrode 590 includes a second ferromagnetic electrode layer 590L and a second ferromagnetic pillar 590P that protrudes from the second ferromagnetic electrode layer 590L toward the device layer stack 111.

At least one of the first electrode 510 and/or the second electrode 590 comprises a fixed ferromagnetic material that has a fixed magnetization direction, such as Fe, Co, Ni or alloy thereof. In one embodiment, the fixed magnetization direction is parallel to the interface between the spin polarization layer 120 and the nonmagnetic spacer layer 130. In one embodiment, the first electrode 510 and/or the second electrode 590 may comprise a pinned soft magnetic material or a hard magnetic material. If the electrode comprises the pinned soft magnetic material, then it may additionally include a synthetic ferromagnetic structure (SAF) containing an antiferromagnetic pinning layer and a ferromagnetic layer stack separated from the soft magnetic material by a conductive nonmagnetic spacer.

The first ferromagnetic pillar 510P has substantially the same lateral width (e.g., diameter) as the lateral width (e.g., diameter) of the device layer stack 111. The lateral dimension (e.g., width) of the first electrode layer 510L is larger than that of the first ferromagnetic pillar 510P, such that a ring shaped horizontal surface 510S of the first ferromagnetic electrode layer 510L surrounds the base of the vertical first ferromagnetic pillar 510P. Thus, the first electrode 510 contains a notch 510N at the junction of the first ferromagnetic electrode layer 510L and the first ferromagnetic pillar 510P. When a current flows between the first electrode 510 and the second electrode 590, the ring shaped horizontal surface 510S generates a stray magnetic field along a side surface of the first ferromagnetic pillar 510P. The vertical component of the stray magnetic field is applied to the layers of the device layer stack 111, and is used as the bias magnetic field instead of the bias magnetic field generated by the electromagnet 140 in the first embodiment. Preferably, the notch 510N depth is larger than its width to generate the vertical stray magnetic field. The notch can also function as a shield to resist an external field to stabling the STO 500 frequency.

The second ferromagnetic pillar 590P has substantially the same lateral width (e.g., diameter) as the lateral width (e.g., diameter) of the device layer stack 111. The lateral dimension (e.g., width) of the second ferromagnetic electrode layer 590L is larger than that of the second ferromagnetic pillar 590P, such that a ring shaped horizontal surface 590S of the second electrode layer 590L surrounds the base of the vertical second ferromagnetic pillar 590P. Thus, the second electrode 590 contains a notch 590N at the junction of the second ferromagnetic electrode layer 590L and the second ferromagnetic pillar 590P. When a current flows between the first electrode 510 and the second electrode 590, the ring shaped horizontal surface 590S generates a stray magnetic field along a side surface of the second ferromagnetic pillar 590P. The vertical component of the stray magnetic field is applied to the layers of the device layer stack 111, and is used as the bias magnetic field instead of the bias magnetic field generated by the electromagnet 140 in the second embodiment. Preferably, the notch 590N depth is larger than its width to generate the vertical stray magnetic field. The notch can also function as a shield to resist an external field to stabling the STO 500 frequency.

In one embodiment, sidewalls of the layers of the device layer stack 111 are vertically coincident with a sidewall of the first ferromagnetic pillar 510 and/or the second ferromagnetic pillar 590P.

Figure 6:
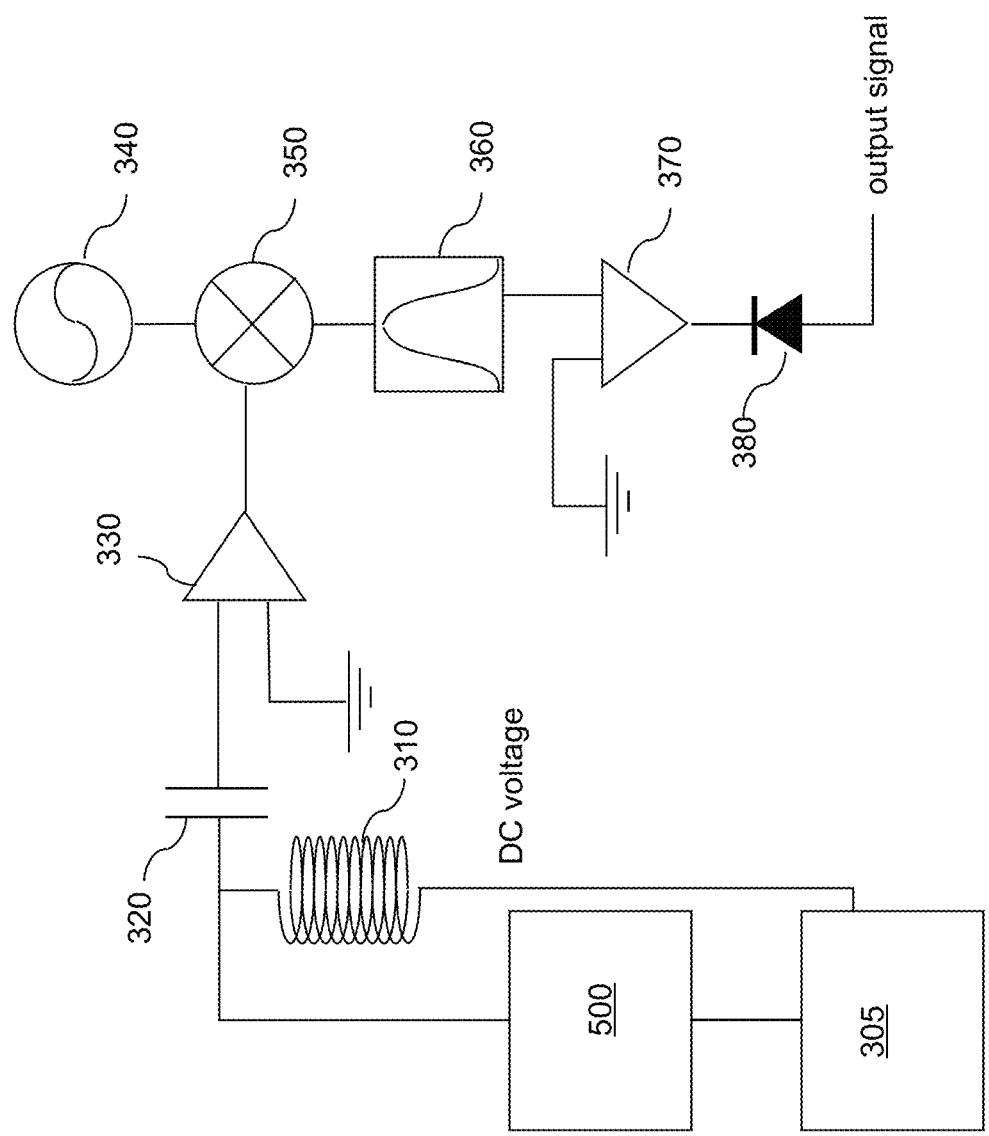
FIG. 6 is a schematic view of a third exemplary periodic signal generator according to the second embodiment of the present disclosure.

Referring to FIG. 6, a third exemplary periodic signal generator according to the second embodiment of the present disclosure is illustrated. The second periodic signal generator can be derived from the first periodic signal generator of FIG. 2 by replacing the instance of the first exemplary spin torque oscillator 100.

Figure 7:
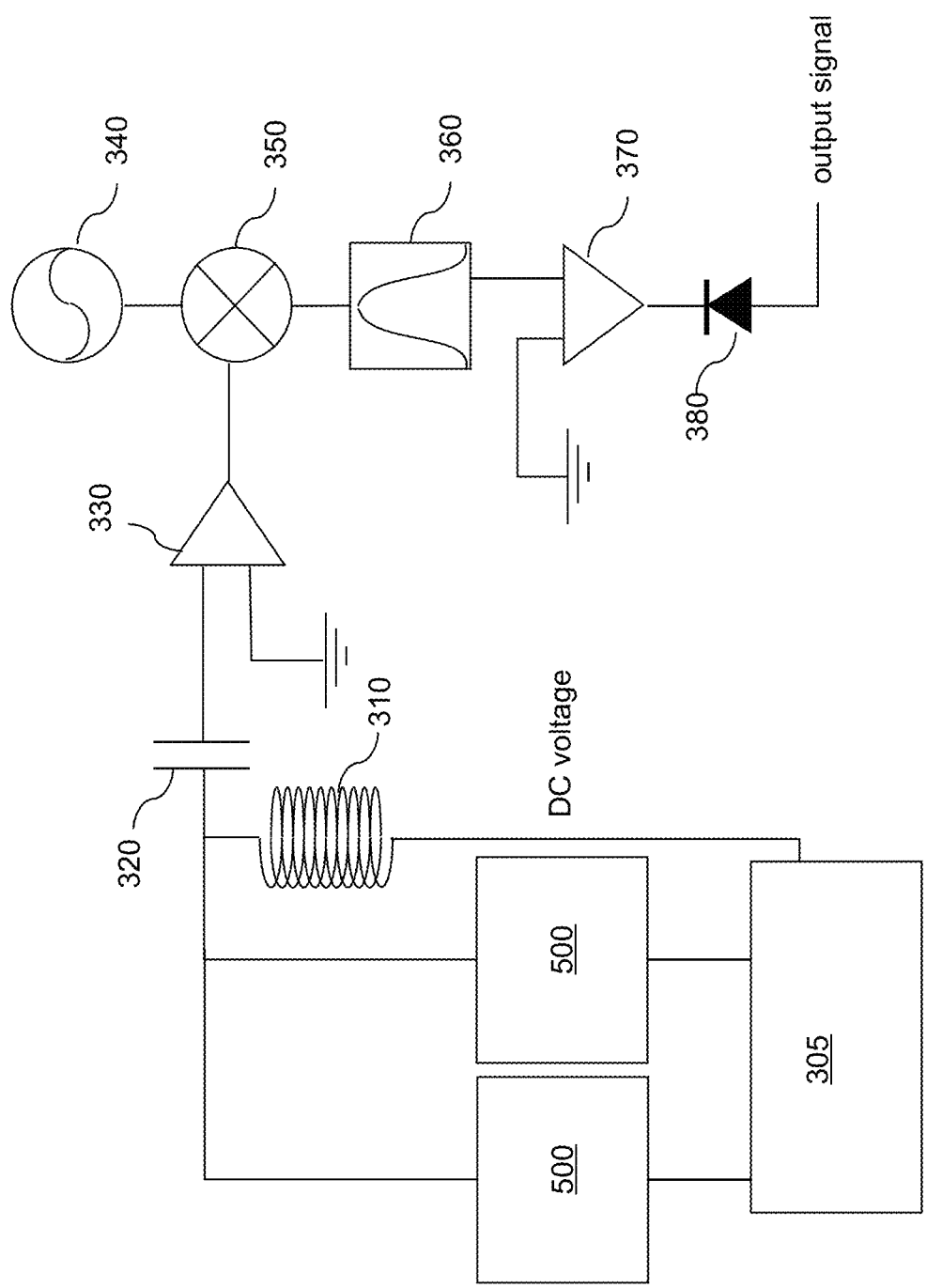
FIG. 7 is a schematic view of a fourth exemplary periodic signal generator according to the second embodiment of the present disclosure.

Referring to FIG. 7, a fourth exemplary periodic signal generator according to the second embodiment of the present disclosure is illustrated, which can be derived from the third exemplary periodic signal generator of FIG. 6 by connecting multiple instances (such as two or more instances) of the second exemplary spin torque oscillator 500 of FIG. 5 in a parallel connection configuration.

Figure 8:
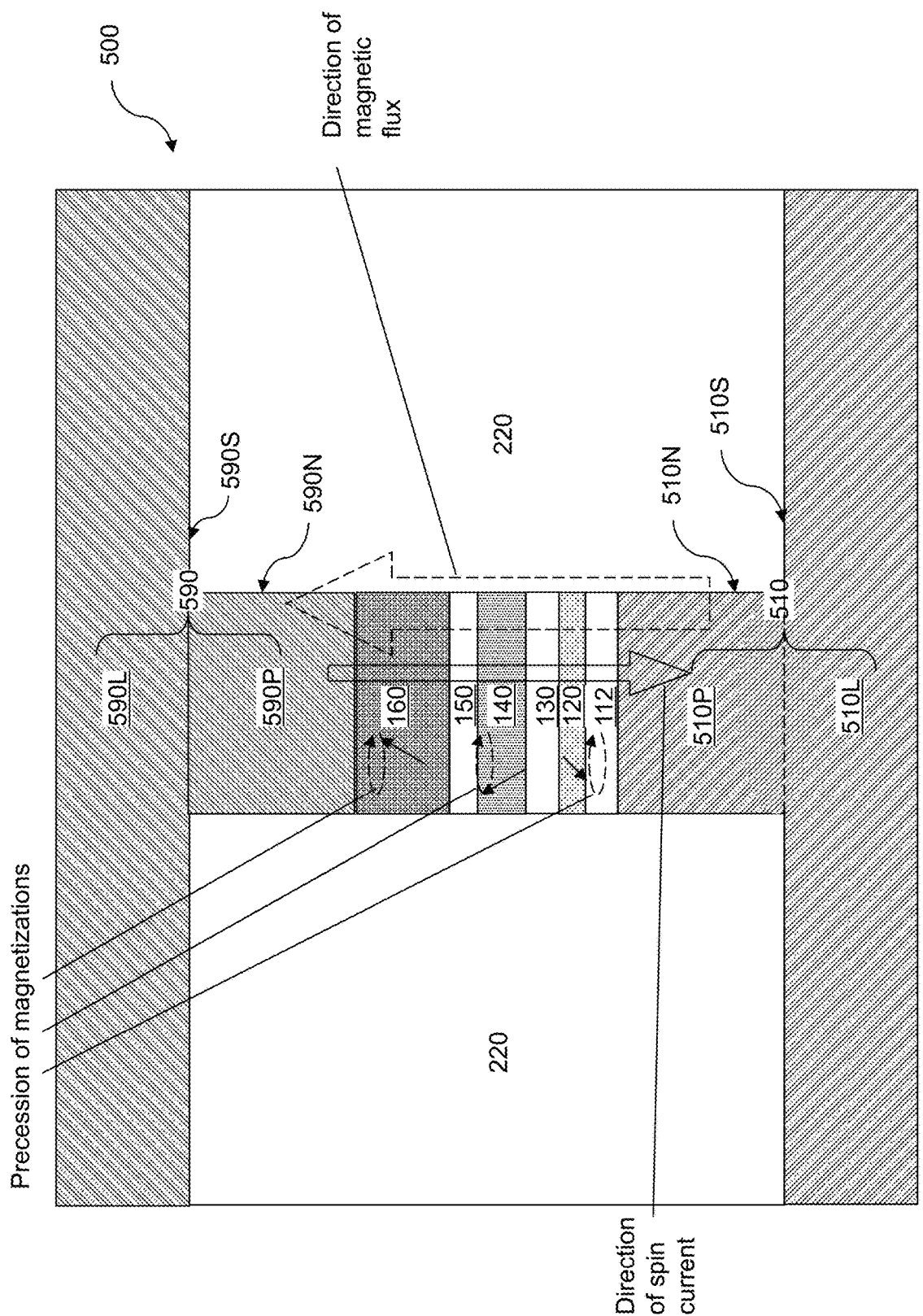
FIG. 8 is a vertical cross-sectional view of the second exemplary spin torque oscillator in the presence of a spin current according to the second embodiment of the present disclosure.

Referring to FIG. 8, alignment of magnetizations of component layers within the device layer stack 111 in the second exemplary spin torque oscillator 500 is illustrated in the presence of a direct current bias spin current according to the second embodiment of the present disclosure. A direct current bias voltage may be applied between the first and second electrodes (510, 590) by the control circuit 305. One or more notches (510N, 590N) generate the magnetic field having a vertical direction antiparallel to the direction of the spin current while the electromagnet 240 may be omitted. The magnetic field functions similar to the external magnetic field generated by the electromagnetic 240 of the first embodiment to precess the magnetization of the layers of the device layer stack 111 in a similar manner as in the first embodiment described above with respect to FIG. 4C.

Figure 9:
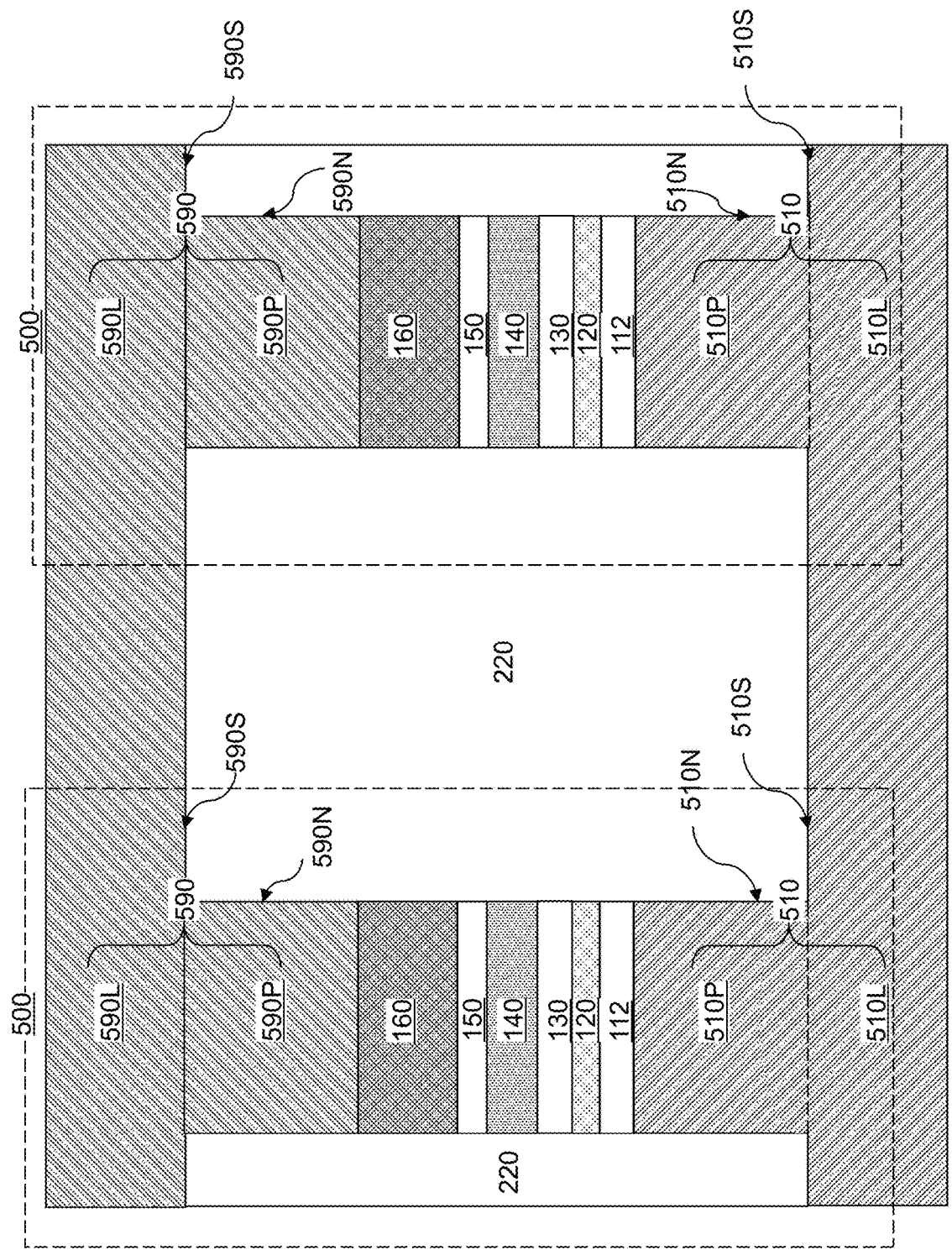
FIG. 9 is a vertical cross-sectional view of a parallel connection of two second exemplary spin torque oscillators according to the second embodiment of the present disclosure.

Referring to FIG. 9, a parallel connection of two second exemplary spin torque oscillators 500 according to the second embodiment of the present disclosure is illustrated. In this case, each first electrode layer 510L of the plurality of instances of the second exemplary spin torque oscillator 500 comprise a respective portion of a common first electrode layer 510L, and each second electrode layer 590L of the plurality of instances of the second exemplary spin torque oscillator 500 comprise a respective portion of a common second electrode layer 590L.

The spin torque oscillators of the embodiments of the present disclosure can be employed for microwave signal generation in cell phones, communication devices, sound analyzers or other communication devices. The synchronized precession of in-plane components of the various ferromagnetic layers provides a narrow oscillation frequency width with a high intensity (e.g., detected voltage or power output from the STO within integrated frequency). Thus, the spin torque oscillators of the embodiments of the present disclosure can provide a higher intensity and narrower frequency peaks (e.g., having a smaller half-width at half-maximum) compared to prior art STOs.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A spin torque oscillator comprising:
a first electrode;
a second electrode;
a device layer stack located between the first electrode and the second electrode, wherein the device layer stack comprises:
a spin polarization layer including a first ferromagnetic material;
an assist layer including a third ferromagnetic material;
a ferromagnetic oscillation layer including a second ferromagnetic material located between the spin polarization layer and the assist layer;
a nonmagnetic spacer layer located between the spin polarization layer and the ferromagnetic oscillation layer; and
a nonmagnetic coupling layer located between the ferromagnetic oscillation layer and the assist layer, wherein the assist layer is antiferromagnetically coupled to the ferromagnetic oscillation layer through the non-magnetic coupling layer, and the assist layer has a magnetization that is coupled to a magnetization of the ferromagnetic oscillation layer,
wherein:
at least one of the first or second electrode comprises a ferromagnetic material having a fixed magnetization and comprising a ferromagnetic electrode layer and a ferromagnetic pillar that protrudes from the ferromagnetic electrode layer toward the device layer stack;
the ferromagnetic pillar has substantially a same lateral width as a lateral width of the device layer stack; and
a lateral width of the ferromagnetic electrode layer is larger than the lateral width of the ferromagnetic pillar, such that a ring shaped horizontal surface of the ferromagnetic electrode layer surrounds a base of the ferromagnetic pillar to provide a notch at a junction of the ferromagnetic electrode layer and the ferromagnetic pillar.

2. The spin torque oscillator of claim 1, wherein the ferromagnetic oscillation layer has a greater magnetic moment-thickness product than the spin polarization layer.

3. The spin torque oscillator of claim 2, wherein a ratio of a magnetic moment-thickness product of the ferromagnetic oscillation layer to a magnetic moment-thickness product of the spin polarization layer is in a range from 1.2 to 5.

4. The spin torque oscillator of claim 2, wherein the antiferromagnetically coupled assist layer has a greater magnetic moment-thickness product than the ferromagnetic oscillation layer.

5. The spin torque oscillator of claim 4, wherein a ratio of a magnetic moment-thickness product of the antiferromagnetically coupled assist layer to a magnetic moment-thickness product of the ferromagnetic oscillation layer is in a range from 2 to 10.

6. The spin torque oscillator of claim 1, further comprising a control circuit configured to apply a bias voltage between the first and the second electrodes to induce flow of a spin current through the device layer stack between the first and the second electrodes.

7. The spin torque oscillator of claim 6, wherein:
a magnetization of the ferromagnetic oscillation layer is ferromagnetically coupled to a magnetization of the spin polarization layer while the spin current does not flow through the device layer stack; and
the magnetization of the ferromagnetic oscillation layer and the magnetization of the spin polarization layer are in-plane magnetizations that are parallel to an interface between the spin polarization layer and the nonmagnetic spacer layer while the spin current does not flow through the device layer stack.

8. The spin torque oscillator of claim 7, wherein while the spin current flows through the device layer stack:
the ring shaped horizontal surface generates a stray magnetic field along a side surface of the ferromagnetic pillar such that a vertical component of the stray magnetic field is applied to the layers of the device layer stack as a bias magnetic field; and
the magnetization of the spin polarization layer follows the magnetization of the ferromagnetic oscillation layer in an antiparallel direction, while an azimuthal angle of an in-plane component of the magnetization of the ferromagnetic oscillation layer is the same as an azimuthal angle of the in-plane component of the magnetization of the spin polarization layer.

9. The spin torque oscillator of claim 8, wherein the magnetization of the ferromagnetic oscillation layer and the magnetization of the assist layer are in-plane magnetizations that are antiparallel to each other and are parallel to an interface between the ferromagnetic oscillation layer and the nonmagnetic spacer layer while the spin current does not flow through the device layer stack.

10. The spin torque oscillator of claim 9, wherein:
the magnetization of the assist layer is coupled to the magnetization of the ferromagnetic oscillation layer, and precesses around a vertical axis with a same precession frequency as the magnetization of the spin polarization layer while the spin current flows through the device layer stack; and
the azimuthal angle of the in-plane component of the magnetization of the ferromagnetic oscillation layer is offset by 180 degrees from an azimuthal angle of an in-plane component of the magnetization of the assist layer while the spin current flows through the device layer stack.

11. The spin torque oscillator of claim 1, wherein:
the first ferromagnetic material of the spin polarization layer comprises Fe, Co, Ni, a ferromagnetic alloy including at least one of Fe, Co or Ni, or a magnetic Heusler alloy;
the nonmagnetic spacer layer comprises a nonmagnetic metal, a semiconductor material, magnesium oxide or aluminum oxide;

the second ferromagnetic material of the ferromagnetic oscillation layer comprises Fe, Co, Ni, a ferromagnetic alloy including at least one of Fe, Co or Ni, or a magnetic Heusler alloy;
the nonmagnetic coupling layer comprises ruthenium, rhodium or iridium; and
the third ferromagnetic material of the assist layer comprises Fe, Co, Ni, a ferromagnetic alloy including at least one of Fe, Co or Ni, or a magnetic Heusler alloy.

12. The spin torque oscillator of claim 11, wherein:
the spin polarization layer has a thickness in a range from 1 nm to 3 nm;
the nonmagnetic spacer has a thickness in a range from 0.8 nm to 3 nm;
the ferromagnetic oscillation layer has a thickness in a range from 2 nm to 15 nm;
the nonmagnetic coupling layer has a thickness in a range from 0.4 nm to 2 nm; and
the assist layer has a thickness in a range from 2 nm to 100 nm.

13. The spin torque oscillator of claim 1, wherein:
the first electrode comprises the ferromagnetic material having the fixed magnetization; the ferromagnetic electrode layer comprises a first ferromagnetic electrode layer;
the ferromagnetic pillar comprises a first ferromagnetic pillar; and
sidewalls of the device layer stack are vertically coincident with a sidewall of the first ferromagnetic pillar.

14. The spin torque oscillator of claim 13, wherein:
the second electrode also comprises the ferromagnetic material having the fixed magnetization;
the second electrode comprises a second ferromagnetic electrode layer and a second ferromagnetic pillar protruding toward the device layer stack;
the second ferromagnetic pillar has substantially a same lateral width as a lateral width of the device layer stack such that sidewalls of the device layer stack are vertically coincident with a sidewall of the second ferromagnetic pillar; and
a lateral width of the second ferromagnetic electrode layer is larger than the lateral width of the second ferromagnetic pillar, such that a ring shaped horizontal surface of the second ferromagnetic electrode layer surrounds a base of the second ferromagnetic pillar to provide a second notch at a junction of the second ferromagnetic electrode layer and the second ferromagnetic pillar.

15. A periodic signal generator comprising:
at least one spin torque oscillator of claim 1; and
a signal amplifier circuit configured to output a microwave signal having a frequency in a range from 2 GHz to 100 GHz.

16. The periodic signal generator of claim 15, further comprising a plurality of the spin torque oscillators in a parallel connection configuration.

* * * * *